United States Patent [19]

Falk

[11] Patent Number: 4,964,687
[45] Date of Patent: Oct. 23, 1990

[54] OPTICAL LATCH AND METHOD OF LATCHING DATA USING SAME

[75] Inventor: R. Aaron Falk, Renton, Wash.

[73] Assignee: The Boeing Company, Seattle, Wash.

[21] Appl. No.: 414,016

[22] Filed: Sep. 29, 1989

[51] Int. Cl.$^5$ .................. G02B 6/10; G06E 1/04; G11C 21/00; H03K 17/80

[52] U.S. Cl. ............... 350/96.13; 350/96.11; 350/96.14; 350/96.15; 350/320; 364/713; 364/715.01; 365/64; 365/76; 307/409

[58] Field of Search ............. 350/96.11, 96.12, 96.13, 350/96.14, 96.10, 96.15, 96.16, 320; 364/713, 715.01, 822, 900, 807; 365/64, 76, 78; 307/407, 409; 250/213 A

[56] References Cited

U.S. PATENT DOCUMENTS

| | | | |
|---|---|---|---|
| 3,585,413 | 6/1971 | Nakagome et al. | 250/213 A |
| 3,781,081 | 12/1973 | Rokos | 360/374 X |
| 4,052,705 | 10/1977 | Schaefer et al. | 350/96.25 X |
| 4,363,106 | 12/1982 | Tai | 364/713 |
| 4,506,151 | 3/1985 | MacDonald et al. | 250/213 A |
| 4,511,207 | 4/1985 | Newton et al. | 350/96.15 |
| 4,577,189 | 3/1986 | Adolfsson et al. | 250/213 A |
| 4,588,255 | 5/1986 | Tur et al. | 350/96.16 |
| 4,689,793 | 8/1987 | Liu et al. | 372/8 |
| 4,761,060 | 8/1988 | Sawano | 350/96.15 X |
| 4,797,843 | 1/1989 | Falk et al. | 364/713 |
| 4,890,893 | 1/1990 | Smoot | 350/96.15 |
| 4,900,115 | 2/1990 | Hearing et al. | 350/96.15 |
| 4,910,699 | 3/1990 | Capps et al. | 364/746 |

OTHER PUBLICATIONS

S. F. Habiby et al., "Optical Residuce Addition and Storage Units Using a Hughes Liquid Crystal Light Valve", NASA Conference (Aug. 1983), Publication 2302, Optical Information Processing for Aerospace Applications II, 1984, pp. 215–239.

Akmenkalns et al., "Optical Controlled Latch Circuit", I.B.M. Tech. Discl. Bull., vol. 3, No. 3, 8/60, p. 38.

*Primary Examiner*—Brian Healy
*Attorney, Agent, or Firm*—Foley & Lardner, Schwartz, Jeffery, Schwaab, Mack, Blumenthal & Evans

[57] ABSTRACT

An optical latch includes first and second optical switches arranged in series. An input signal is received in the first optical switch and is passed through to the second optical switch. The second optical switch latches-up to this received signal. Then the first optical switch is disabled to isolate the second optical switch from inputs to the first optical switch. Feedback lines from the output of the second optical switch to the input of the second optical switch ensure that the second optical switch remains latched. Switching signals are provided at appropriate timing to ensure correct operation of the optical latch.

13 Claims, 3 Drawing Sheets

FIG. 1
PRIOR ART
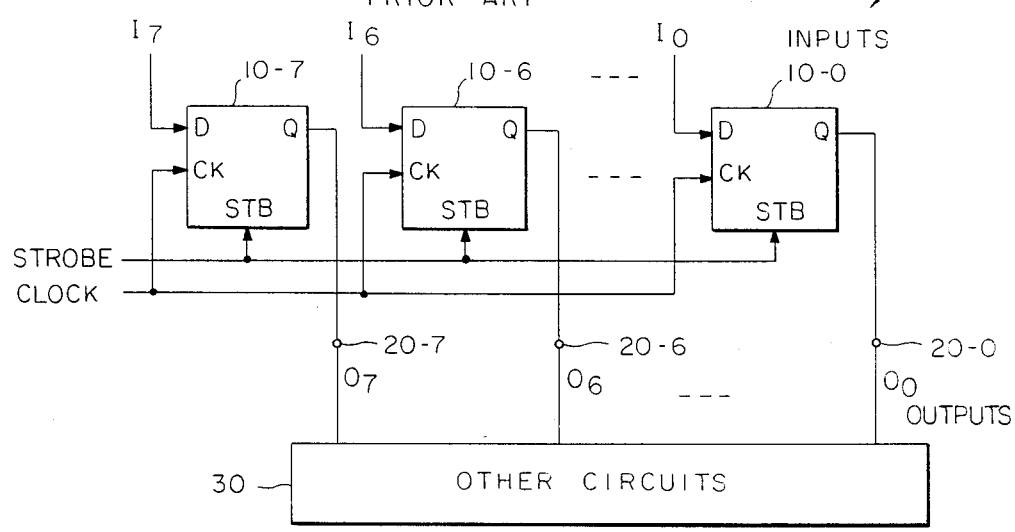
FIG. 2
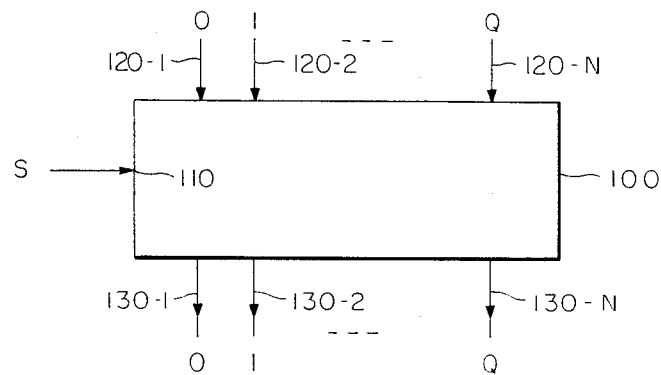
FIG. 3

OPTICAL LATCH AND METHOD OF LATCHING DATA USING SAME

BACKGROUND OF THE INVENTION

The invention relates to the field of optical information processing. More specifically, the invention relates to an optical latch for use in optical information processors.

Electronic latches are well known. Electronic latches are a fundamental part of any electronic computer system. Latches are used as temporary registers and as long term memory storage devices. Even relatively simple information processors will typically contain at least several latches.

FIG. 1 illustrates a type of prior art electronic latch 300. The latch illustrated in FIG. 1 is also called an 8-bit register. The latch 300 includes 8 integrated circuit D flip-flops 10-0, ..., 10-7 arranged in parallel. When a CLOCK pulse occurs at time $t_1$ the values of the input bits $I_0$ through $I_7$ are stored in their associated D flip-flop 10. Each input bit $I_0$ through $I_7$ may be either a logic 0 or a logic 1. For example, $I_0$ and $I_1$ may be 0 while $I_2$ through $I_7$ may be 1. At a second CLOCK pulse $t_2$ ($t_2 > t_1$) the stored input bits are transmitted as output bits $O_0$ through $O_7$. In this manner the latch 300 acts as a storage register.

The latch 300 also includes an additional control signal called STROBE. When the STROBE signal is active the output terminals 20-0, ..., 20-7 go into a high impedance state rather than transmitting voltages or currents associated with logical values of 0 or 1. The high impedance state prevents the output terminals 20 from driving or loading any other circuits 30 connected to the latch 300. Thus, the high impedance state allows the latch 300 to be electrically disconnected from other circuits to which the latch is physically connected.

Optical information processors have recently received considerable attention. There are fundamental differences between optical processors based on optical circuits, in which the information carriers are photons, and electronic processors based on electronic circuits, in which the information carriers are electrons. In optical circuits the photon carriers do not interact with one another, while in electronic circuits the electron carriers do interact with one another. This means that in optical circuits interconnect possibilities exist which do not exist with electronic circuits. In particular, optical circuits allow parallel architectures which perform arithmetic and logical operations in completely parallel, single step processes. Since the speed of optical devices is essentially limited to the time it takes for a photon to transit a device, no faster computation time is possible.

Optical information processors require efficient and simple optical latches analogous to the electronic latch 300 described above. Optical addition and storage units have been proposed by Habiby et al. in "Optical Information Processing For Aerospace Applications II," NASA Conference Publication 2302, Aug. 30–31, 1983, incorporated herein by reference. The adder disclosed by Habiby et al. uses optical Fourier transform techniques in conjunction with a liquid crystal light valve to perform positionally encoded residue number system addition. The adder disclosed in Habiby et al. may be used as a storage unit by fixing one input at zero. However, the Habiby et al. storage unit can only be used with positionally encoded, or one-active-line-at-a-time, inputs. In other words, the Habiby et al. storage unit cannot accommodate more than one active input line. Since binary representations of a number typically have more than one non-zero bit, the Habiby et al. storage unit will not accommodate binary encoded inputs. In addition, the Habiby et al. unit would be slow in operation due to the use of a light valve and also requires a rather complicated light valve structure and other hardware.

U.S. Pat. No. 4,797,843 issued to Falk et al. on Jan. 10, 1989 and entitled "Parallel Optical Arithmetic/Logic Unit," incorporated herein by reference, discloses an adder which could be used as a storage unit by fixing one input at zero. However, the adder disclosed in the '843 patent, which also uses Fourier transform techniques, can also only be used with positional encoding. The '843 adder would produce spurious outputs if more than one input line in a channel were active.

SUMMARY OF THE INVENTION

It is an object of the invention, therefore, to provide an optical latch which can be used to latch input signals which have more than one active input.

It is another object of the invention to provide an optical latch suitable for use with state-of-the-art optical information processors.

According to a first aspect of the invention there is provided an optical latch which includes a first optical switch and a second optical switch. The first optical switch receives a plurality of first optical switch input signals. The first optical switch transmits the plurality of first optical switch input signals on first optical switch output signal lines when a first switch signal is in an active state. The first optical switch does not transmit the plurality of first optical switch input signals on the first optical switch output signal lines when the first switch signal is in an inactive state. The second optical switch has second optical switch input signal lines connected to the first optical switch output signal lines. The second optical switch transmits second optical switch input signals, received via the second optical switch input signal lines, on second optical switch output signal lines when a second switch signal is in the active state. The second optical switch does not transmit the second optical switch input signals on the second optical switch output signal lines when the second switch signal is in an inactive state. The optical latch also includes a plurality of feedback signal lines to transmit optic signals from the second optical switch output signal lines to the second optical switch input signal lines in order to permit the second optical switch to hold, or latch, data.

According to a second aspect of the invention there is provided a method of latching optical data. The method includes receiving a plurality of input signals in a first optical switch and then passing the plurality of input signals to a second optical switch when a first switch signal is active. The plurality of input signals are received in the second optical switch and then passed through the second optical switch to an output of the second optical switch when a second switch signal is active. Feedback signals from the output of the second optical switch are transmitted to an input of the second optical switch such that the output of the second optical switch is held, or latched. Output signals are then transmitted from the second optical switch. The process described above is then repeated.

BRIEF DESCRIPTION OF THE DRAWINGS

The invention is described below with reference to the accompanying drawings, wherein:

FIG. 1 illustrates a prior art electronic latch;

FIG. 2 illustrates a multi-input switch;

FIG. 3 illustrates a look-up table of the multi-input switch of FIG. 2;

DETAILED DESCRIPTION OF THE PREFERRED EMBODIMENTS

Figure 4:
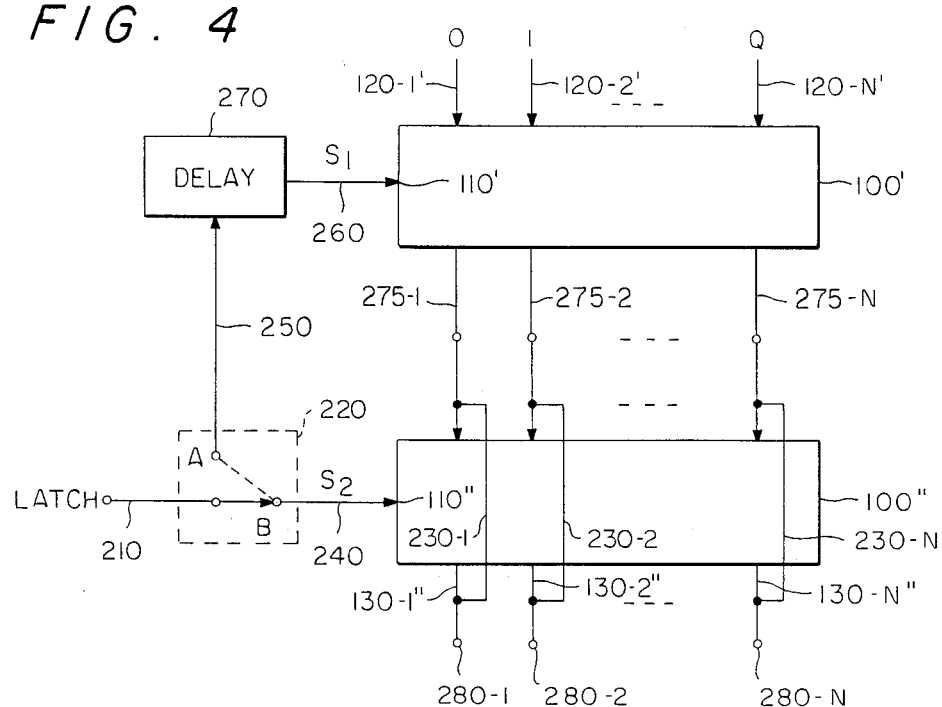
FIG. 4 illustrates an optical latch according to a first preferred embodiment of the invention.

Optical processing systems are disclosed in U.S. Pat. No. 4,797,843, cited above, and in applications Ser. No. 07/019,761, filed Feb. 27, 1987, pending, and entitled "Optical Cross Bar Arithmetic/Logic Unit"; Ser. No. 07/219,392, pending filed July 15, 1988, and entitled "Optical Computer Including Pipelined Conversion of Numbers to Residue Representation"; and Ser. No. 07/233,610, now U.S. Pat. No. 4,910,699, filed Aug. 18, 1988, and entitled "Optical Computer Including Parallel Residue to Binary Conversion"; all incorporated herein by reference. The invention can be used in conjunction with the inventions described in the above-cited patent and co-pending applications and in other optical processing systems.

The 07/019,761 co-pending application, cited above, describes an optical cross bar arithmetic and logic unit (ALU) which uses a table look-up approach to perform residue arithmetic. As described in the 07/019,761 copending application, such an optical cross bar ALU can perform a variety of multilevel logic functions in addition to residue arithmetic. In this invention, an optical ALU (OALU), such as an OALU of the types described in the 07/019,761 co-pending application, is used as a multi-input switch. Two of these multi-input switches are then combined to form an optical latch.

FIG. 2 illustrates a multi-input switch 100 and FIG. 3 illustrates the look-up table for the multi-input switch 100. The switch 100 receives optical signals on input lines 120-1 through 120-N and transmits data on output lines 130-1 through 130-N. Each of the individual input and output lines, for example, line 120-2 and line 130-3, is comprised of an individual optical signal line. Further, each signal line is generally associated with a separate light source (not shown) or at least a separate light valve or switch such that each line may be separately energized and de-energized so that binary (on/off) data may be represented on each line. (This is also true for the embodiments of FIGS. 4-7). Further, the input lines themselves may be positionally encoded to represent residue numbers in a residue number system (RNS) useful for doing no-carry arithmetic operations. Such RNS are disclosed more fully in co-pending application Ser. No. 019,761, filed Feb. 27, 1987, and incorporated herein by reference.

The switch 100 also receives a switch signal S from an optical signal line at a connection 110. As shown in FIG. 3, when the S signal is on (or lighted), i.e., "1", then any "1" on input lines 120 will appear at output lines 130. Further, any zero on input lines 120 will also appear as a zero on output lines 130. When the S signal is off (or not lighted), i.e., a "0", then no output appears at output lines 130, i.e., the null or "0" states occur at all of the output lines 130. The process performed by the multi-input switch 100 is equivalent to an AND operation performed for the S and the N input lines and is implemented in a 2×N table look-up, cross-bar structure as, for example, shown in co-pending application 07/019,761.

If only one of input lines 120-1 through 120-N is on at any given time, the multi-input switch 100 can be implemented using a Fourier transform type OALU such as described in the '843 patent, cited above, or an optical cross bar type OALU as described in the 07/019,761 co-pending application, cited above. However, if more than one of input lines 120-1 through 120-N could be on at any given time, the optical cross bar type OALU is used to implement the multi-input switch 100, since a Fourier transform type OALU could produce spurious outputs when given an input which has multiple input lines on. More than one of the input lines 120-1 through 120-N would typically be on if the input lines 120 are representing information in binary or other non-positional notations. A further description of the implementation of multi-input switch 100 will be provided below after the overall optical latch design is described in detail.

FIG. 4 illustrates an optical latch 200 according to a first preferred embodiment of the invention. The optical latch 200 receives an input on input signal lines 120-1' through 120-N' when a LATCH signal on signal line 210 is in an on, or active, state and makes available, or holds, output signals on output lines 130-1'' through 130-N''. In this manner the optical latch 200 acts as a storage element.

The optical latch 200 includes two multi-input switches 100' and 100'' connected in series. Throughout this description, single primed numbers will be used to refer to the first multi-input switch 100' and associated components and double primed numbers will be used to refer to second multi-input switch 100'' and associated components.

The output of first switch 100' is connected to the input of second switch 100'' via signal lines 275. The switches 100' and 100'' are identical to switch 100 described with respect to FIG. 2. Feedback lines 230-1 through 230-N feed back the output from second switch 100'' to the input to second switch 100''.

The LATCH signal on signal line 210 is directed to either second switch 100'', via signal line 240, or to first switch 100', via signal lines 250 and 260 and delay circuit 270, depending upon the position of toggle switch 220. Input lines 120, output lines 130, and signal lines 210, 230, 240, 250, 260, and 275 are optical signal lines or an equivalent optical transmission path.

The operation of optical latch 200 will now be described.

With the toggle switch 220 in the down, or B, position, any data at input lines 120' is blocked from reaching second switch 100'' by first switch 100'. The input data is blocked because the $S_1$ input to first switch 100' is 0, or off, due to the toggle switch 220 being at the B position. The output from second switch 100'' is fed back to the input of second switch 100'' via feedback lines 230. Thus, the only inputs to second switch 100'', when switch 220 is in the B position, are its own output, thus maintaining the outputs of second switch 100'' unchanged, or latched. The outputs of second switch 100" are made available at connections 280-1 through 280-N to be used by other optical information processing circuitry (not shown). Similar to the high impedance state of an electronic latch, the optical latch does not effect connected circuitry when the outputs at connections 280 are zero (i.e., no light).

If toggle switch 220 is switched to position B when data from first switch 100' is present at the inputs to second switch 100", then feedback from feedback lines 230 will cause second switch 100" to remain latched-up to the data from the first switch 100' even when the data from first switch 100' is no longer present.

The second switch 100" reacts poorly if it is given an additional set of input data once latched. Specifically, in this case the second switch 100" will latch to a combination of the signals from the two inputs, that is, the combination of the signal from first switch 100' and the signal from a feedback line 230. In order to prevent the second switch 100" from latching to a combination of the two inputs, the first switch 100' is operated in conjunction with toggle switch 220 and delay circuit 270 to present data to second switch 100" only at certain times. Specifically, data is presented to second switch 100" only when previously latched data has already been used by attached optical information processing systems (not shown).

When toggle switch 220 is moved to the A position the outputs of second switch 100" will turn off after some turn-off time delay $T_2$ and the second switch 100" will no longer be operating as a latch, i.e., all outputs will be zero. A delay time $T_1$ of delay circuit 270 is slightly longer than turn-off delay time $T_2$ of second switch 100" or a turn-on delay time $T_3$ of second switch 100". The time delay provided by delay circuit 270 allows second switch 100" to be fully turned off before the first switch 100' turns on.

Turning on the first switch 100', by placing toggle switch 270 in the A position, allows data at input lines 120' to pass through first switch 100' to second switch 100". The toggle switch 220 is then returned to the B position. The $T_1$ time delay permits holding the first switch 100' on long enough for the second switch 100" to latch-up to the new data from first switch 100'. In order to hold the first switch 100' on long enough, the $T_1$ delay must be longer than the $T_3$ turn-on delay. Returning toggle switch 220 to the B position completes the latching process.

Any mechanical, opto-electronic, or optical switch capable of directing light on signal 210 to line 240 or to line 250 can be employed as toggle switch 220. Any opto-electronic or optical circuit which produces a sufficient time delay can be employed as delay circuit 270. Delay circuit 270 can be comprised of, for example, an OALU adder with one input set to zero or an OALU multiplier with one input set to one. Suitable OALUs are referenced above.

Figure 5:
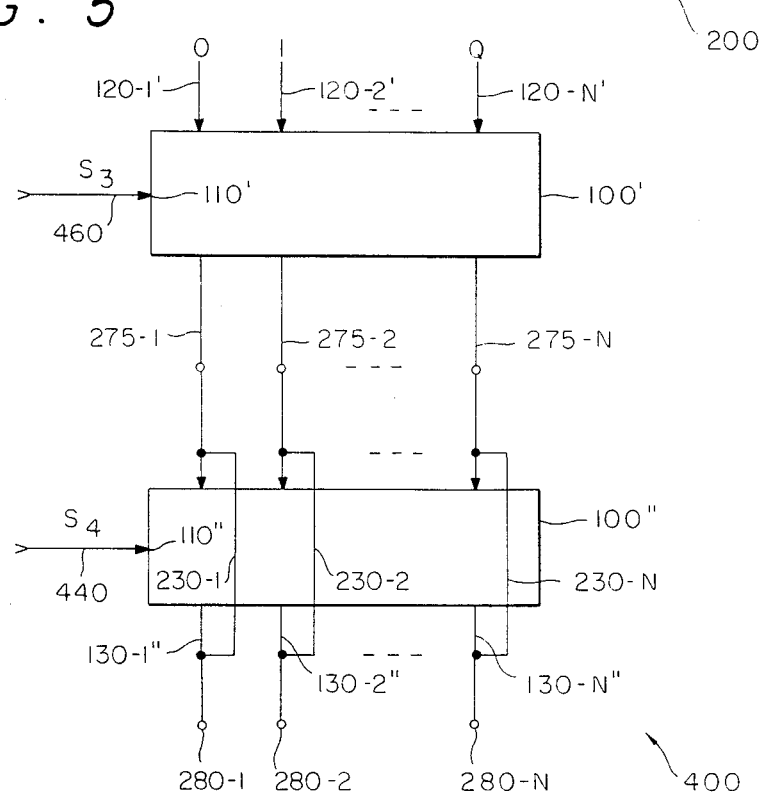
FIG. 5 illustrates an optical latch according to a second preferred embodiment of the invention.

FIG. 5 illustrates an optical latch 400 according to a second preferred embodiment. The second preferred embodiment illustrated in FIG. 5 is identical to the first preferred embodiment of FIG. 4 except that the delay circuit 270, toggle switch 220, and lines 210, 240, 250, and 260 of FIG. 4 have been deleted. In the FIG. 5 embodiment, two separate control lines 440 and 460 are provided instead of the toggle switch 220 and delay circuit 270. The timing of the $S_3$ signal on signal line 460 and the $S_4$ signal on signal line 440 is arranged to have the same relationship in time as the $S_1$ and $S_2$ signals of the FIG. 4 first preferred embodiment. Lines 440 and 460 are optical lines.

Figure 6:
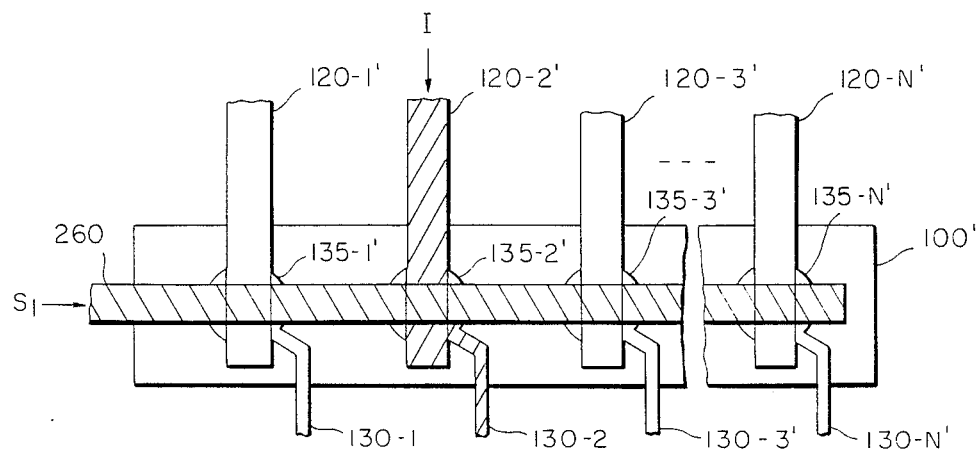
FIG. 6 is an illustration of an optical cross bar arithmetic and logic unit.

FIG. 6 illustrates the principles of an optical crossbar arithmetic and logic unit employed as multi-input first switch 100'. Principles similar to those illustrated in FIG. 6 apply to second multi-input switch 100". Various alternative embodiments and specific construction details concerning the arithmetic and logic unit illustrated in FIG. 6 are further described in the 07/019,761 co-pending application cited above.

The first switch 100' illustrated in FIG. 6 receives optical signals via signal lines 120'. In general, some of the signal lines will be lighted, for example, signal line 120-2', and some signal lines will not be lighted, for example, signal lines 120-1', 120-3', and 120-N'. When lighted, all of the signal lines transmit light of the same intensity I. More than one input signal line may be lighted at one time. The $S_1$ signal is transmitted via signal line 260 along a path at a different angle than the input signals received via signal lines 120'. When the $S_1$ signal is active, or lighted, light of intensity I is transmitted along the light path associated with signal line 260. The paths of light from input signal line's 120' and the path of light from signal line 260 intersect at light detectors 135'. Each detector 135' is set to trigger upon receiving light of intensity 2I (the threshold value) and otherwise does not fire. Upon detecting the threshold intensity, each detector 135' transmits an optical signal along its associated signal line 130'. Only when both an input signal is lighted and the $S_1$ signal is lighted will a detector 135' transmit an output signal on its associated signal line 130'.

Detectors 135' may comprise, for example, a photodiode coupled to an electronic threshold circuit. An electric signal is generated by this combination upon detection of the threshold intensity. This electric signal is then coupled to the photodiode to generate a light beam along lines 130-1' through 130-N'. Alternately, the detectors 135' may take the form of thin layers of optical non-linear material which changes its index of refraction upon receipt of a threshold light intensity as described more fully below and in more detail in co-pending application No. 07/414,475 by R. Aaron Falk entitled "Optical AND Gate for Use in a Cross-bar Arithmetic/Logic Unit" (attorney docket No. 16753/138), filed Sep. 29, 1989 and incorporated herein by reference.

In the FIG. 6 example, the intensity of light at each of the detectors 135-1', 135-3', and 135-N' is I, therefore output signal lines 130-1', and 130-3', and 130-N' will not transmit a lighted optical signal. On the other hand, the intensity of light at detector 135-2' is 2I. Therefore detector 135-2' will transmit a "lighted" optical signal on line 130-2'. When the $S_1$ signal is not active (lighted), none of the detectors 135' will detect light of intensity 2I, regardless of the signals on input signal lines 120'. Therefore, when the $S_1$ signal is not active, that is, when a lighted signal is not received via signal line 260, the input signals to first switch 100' will not be passed through to the second switch 100".

The feedback signal lines 230 of FIGS. 4 and 5 can be implemented using several different optical techniques, such as optical fibers, integrated optics, or mirrors. Different techniques may be used in different applications depending on the specific types of OALUs being employed in a given hardware implementation.

It is important that the source driving signal lines 130-1" to 130-N" of second switch 100" have enough power to drive the input to the feedback loops 230 as well as equipment connected to output connections 280. This requirement is important to all of the optical techniques referred to or described above.

Figure 7:
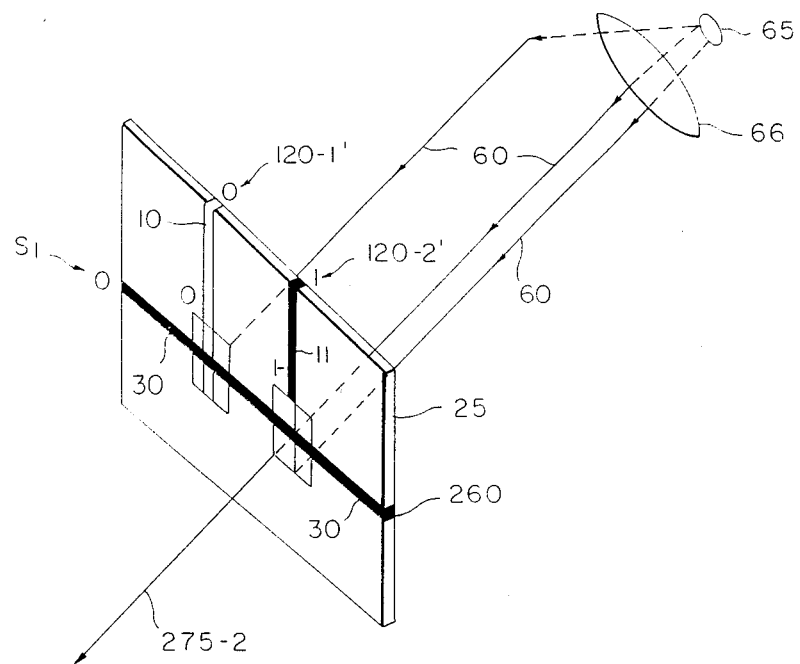
FIG. 7 illustrates an embodiment of the invention employing a non-linear material to fabricate the switching elements of the optical latch.

FIG. 7 illustrates an alternated all-optical embodiment for the switch arrangement instead of FIG. 6. In FIG. 7, a plate 25 of non-linear material is positioned to intercept a light beam 60 generated by means of a light source 65 and suitable optics generally indicated at 66. The plate 25 contains a plurality of optical paths, one path for each of the latch input lines. Using similar numbers as used in for switch 100' in FIG. 4, optical paths 10, 11 within plate 25 correspond respectively to input lines 120-1' and 120-2'. For simplicity of illustration, only these two lines will be considered, and it is assumed that input line 120-1' is inactive (off) whereas input line 120-2' is active (on). A further optical path within plate 25 is path 30 corresponding to the control signal $S_1$ along line 260 of FIG. 4. The input lines 120-1' and 120-2', and the signal $S_1$ are optically connected to the paths 10, 11 and 30 respectively, and each path transmits an intensity of I when the light path is energized (corresponding to a "1" or high signal) and a zero intensity signal otherwise (corresponding to a "0" or low signal). The non-linear material of plate 25 changes its index of refraction at a threshold value equal to 2I resulting form the combined light intensity from the intersection of any energized path 10, 11 with the control signal path 30. Upon change of the index of refraction, the area of the plate included within the intersecting region of the two orthogonal optical paths becomes more optically transmissive and permits passage of the beam 60 through the intersecting region. The beam passing through the intersecting region of paths 11 and 30 is labeled 275-2 and corresponds to the similarly labeled line of FIG. 4. In this manner, a plate may be provided for each of switches 100' and 100" of FIG. 4, and an all optical switching element may be provided to implement an all optical latch.

The foregoing description has been set forth merely to illustrate preferred embodiments of the invention and is not intended to be limiting. The preferred embodiments may be modified without departing from the scope of the invention. For example, optical signals lines can be replaced with electrical signal lines if required for a particular application. Since modification of the described embodiments incorporating the spirit and substance of the invention may occur to persons skilled in the art, the scope of the invention should be limited solely with respect to the appended claims and equivalents.

What is claimed is:

1. An optical latch comprising:
    a first optical switch which receives a plurality of first optical switch input signals, said first optical switch transmitting said plurality of first optical switch input signals on first optical switch output signal lines when a first switch signal is in an active state, said first optical switch not transmitting said plurality of first optical switch input signals cu: said first optical switch output signal lines when said first switch signal is in an inactive state;
    a second optical switch having second optical switch input signal lines connected to said first optical switch output signal lines, said second optical switch transmitting second optical switch input signals received via said second optical switch input signal lines on second optical switch output signal lines when a second switch signal is in an active state, said second optical switch not transmitting said second optical switch input signals on said second optical switch output signal lines when said second switch signal is in an inactive state; and
    a plurality of feedback signal lines to transmit optic signals from said second optical switch output signal lines to said second optical switch input signal lines.

2. An optical latch as set forth in claim 1, further comprising:
    a switch to direct a latch signal to either said first optical switch as said first switch signal or to said second optical switch as said second switch signal; and
    a delay circuit to time delay said latch signal when said latch signal is directed to said first optical switch.

3. An optical latch as set forth in claim 1, wherein said plurality of input signals represent data in a non-positional representation.

4. An optical latch as set forth in claim 1, wherein said first and second optical switches are optical cross bar arithmetic and logic units.

5. An optical latch as set forth in claim 1, wherein said second optical switch has sufficient output power to drive said feedback signal lines and circuits connected to said optical latch.

6. An optical latch as set forth in claim 1 wherein said first switch signal is independent from said second switch signal.

7. An optical latch as set forth in claim wherein said time delay is greater than a turn-off delay time of said second optical switch and is greater than a turn-on delay time of said second optical switch.

8. An optical latch as set forth in claim 6, wherein said first switch signal is time delayed by a time delay value with respect to said second switch signal, and wherein said time delay value is greater than a turn-off delay time of said second optical switch and said time delay value is greater than a turn-on delay time of said second optical switch.

9. A method of latching optical data comprising the steps of:
    (a) receiving a plurality of input signals in a first optical switch;
    (b) passing said plurality of input signals to a second optical switch when a first switch signal is active;
    (c) transmitting feedback signals from an output of said second optical switch to an input of said second optical switch when a second switch signal is active such that said output of said second optical switch is held; and
    (d) transmitting output signals from said second optical switch.

10. A method of latching optical data as set forth in claim 9, further comprising the step of time delaying said first switch signal by a time delay value with respect to said second switch signal, and wherein said time delay value is greater than a turn-off delay time of said second optical switch and said time delay value is greater than a turn-on delay time of said second optical switch.

11. A method of latching optical data as set forth in claim 9, wherein steps (a) through (d) are repeated.

12. A method of latching optical data as set forth in claim 9, wherein the following step is performed after said output of said second optical switch is held:

disabling said first optical switch such that input signals to said first optical switch are isolated from said second optical switch by said first optical switch.

13. A method of latching optical data as set forth in claim 11, wherein said second optical switch is fully turned-off before repeating steps (a) through (d).

* * * * *